United States Patent
Koltsov et al.

(10) Patent No.: US 12,087,524 B2
(45) Date of Patent: Sep. 10, 2024

(54) VOLTAGE SENSOR FOR ELECTRICAL SWITCHGEAR AND ELECTRICAL SWITCHGEAR COMPRISING SAME

(71) Applicant: Tavrida Electric Holding AG, Cham (CH)

(72) Inventors: Vasiliy Viktorovich Koltsov, Moscow (RU); Sergey Ivanovich Malakhovskiy, Chernogolovka (RU); Dmitriy Anatolevich Sokolov, Moscow (RU)

(73) Assignee: TAVRIDA ELECTRIC HOLDING AG, Cham (CH)

( * ) Notice: Subject to any disclaimer, the term of this patent is extended or adjusted under 35 U.S.C. 154(b) by 65 days.

(21) Appl. No.: 17/770,210

(22) PCT Filed: Oct. 27, 2020

(86) PCT No.: PCT/EP2020/080179
§ 371 (c)(1),
(2) Date: Apr. 19, 2022

(87) PCT Pub. No.: WO2021/083893
PCT Pub. Date: May 6, 2021

(65) Prior Publication Data
US 2022/0392723 A1  Dec. 8, 2022

(30) Foreign Application Priority Data

Oct. 29, 2019 (GB) .................................. 1915696

(51) Int. Cl.
*H01H 33/66* (2006.01)
*G01R 15/06* (2006.01)
*G01R 31/58* (2020.01)

(52) U.S. Cl.
CPC ......... *H01H 33/6606* (2013.01); *G01R 15/06* (2013.01); *G01R 31/58* (2020.01)

(58) Field of Classification Search
CPC .. H01H 33/6606; H01H 33/66; H01H 33/668; H01H 9/50; G01R 15/06; G01R 15/16; G01R 31/58; G01R 31/3274
(Continued)

(56) References Cited

U.S. PATENT DOCUMENTS 4,241,373 A 12/1980 Mara et al.
5,585,611 A * 12/1996 Harvey ............... H01H 33/027
218/139
(Continued)

FOREIGN PATENT DOCUMENTS

CN 109545614 * 3/2019 ............. H01H 33/66
DE 4414828 A1 11/1995
(Continued)

OTHER PUBLICATIONS

Translation of CN109545614 (Original document published Mar. 29, 2019) (Year: 2019).*
(Continued)

*Primary Examiner* — William A Bolton
(74) *Attorney, Agent, or Firm* — GRUMBLES LAW PLLC; Brittany Haanan (57) ABSTRACT

A circuit breaker includes a capacitive voltage sensor located within its insulating casing. The voltage sensor includes a capacitor located between the terminals of the circuit breaker adjacent a low potential surface provided by a coil of a current sensor. The capacitor is dome shaped. The voltage sensor does not appreciably increase the size or weight of the circuit breaker and is reliable and accurate.

20 Claims, 2 Drawing Sheets

(58) Field of Classification Search
USPC .......................................... 218/123, 144, 145
See application file for complete search history.

(56) References Cited

U.S. PATENT DOCUMENTS

| | | | |
|---|---|---|---|
| 7,550,960 B2* | 6/2009 | Barbour ................. | G01R 15/06 |
| | | | 324/117 R |
| 10,338,103 B2* | 7/2019 | Gravermann ...... | G01R 19/0084 |
| 10,460,893 B2* | 10/2019 | Shang ................. | H01H 33/027 |
| 2005/0280423 A1 | 12/2005 | Barbour et al. | |
| 2016/0258983 A1* | 9/2016 | Juds ........................ | H01G 4/30 |
| 2017/0285074 A1* | 10/2017 | Korves ................... | H01C 1/02 |
| 2018/0210013 A1* | 7/2018 | Das ........................ | G01R 15/06 |
| 2019/0237260 A1* | 8/2019 | Stollwerck ............. | H01G 4/258 |
| 2019/0302149 A1 | 10/2019 | Kerr | |

FOREIGN PATENT DOCUMENTS

| | | |
|---|---|---|
| EP | 3486662 A1 | 5/2019 |
| JP | S548845 A | 1/1979 |
| JP | S6091807 A | 5/1985 |
| JP | H05223853 A | 9/1993 |

OTHER PUBLICATIONS

Combined Search and Examination Report pertaining to corresponding British Patent Application No. 1915696.7 issued Apr. 16, 2020.
International Search Report and Written Opinion pertaining to PCT/EP2020/080179 issued Jan. 20, 2021.

* cited by examiner

VOLTAGE SENSOR FOR ELECTRICAL SWITCHGEAR AND ELECTRICAL SWITCHGEAR COMPRISING SAME

FIELD OF THE INVENTION

The present invention relates to voltage sensing in electrical switchgear, especially in circuit breakers and reclosers.

BACKGROUND TO THE INVENTION

It is normal to provide circuit breakers and reclosers with a voltage sensor for monitoring voltage at its supply side, and in some applications also at its load side. Conventional voltage sensors may be provided externally of the main body of the circuit breaker or recloser, and may be connected between the relevant circuit breaker/recloser terminal and electrical ground. Such sensors significantly increase the mass and dimensions of the overall unit of which the circuit breaker/recloser is part, decrease reliability due to additional wire bundles from the external sensor to the measurement system, and increase the cost of mounting the overall unit.

It would be desirable to mitigate the problems outlined above.

SUMMARY OF THE INVENTION

A first aspect of the invention provides an electrical switch device comprising:
  a first electrical terminal connected to a first electrical contact;
  a second electrical terminal connected to a second electrical contact;
  means for actuating said second electrical contact between an open state and a closed state; and
  a voltage sensor for sensing a voltage at the first electrical terminal,
wherein said voltage sensor comprises a voltage divider having a voltage input connected to said first electrical terminal, a voltage output between said voltage input and a voltage reference, and a first capacitor connected between said voltage input and said voltage output.

The switch device typically includes an electrically insulating casing, preferably comprising an electrically insulating moulding, and wherein at least said first and second electrical contacts and said first capacitor are provided in said casing, and wherein said first capacitor is located in said casing between said first and second terminals. The first terminal may comprise a conductive member located in said casing and extending between said first electrical contact and an exposed first terminal connector, and said second terminal comprises a conductive member located in said casing and extending between said second contact and an exposed second terminal connector, and wherein said first capacitor is located between said conductive members. The conductive member of said first terminal and the conductive member of said second terminal are typically perpendicular, or substantially perpendicular, with one another.

Preferably, said first capacitor is located closer to the conductive member of said second terminal than to the conductive member of said first terminal, preferably being located adjacent the conductive member of said second terminal.

Preferred embodiments include at least one current sensing coil located around the conductive member of said second terminal, said first capacitor being located adjacent said at least one current sensing coil.

Said first capacitor may be provided on and electrically connected to a conductive support that is located in said casing and is electrically connected to the first terminal. Said first capacitor may be provided on an end of said support, and is preferably shaped and dimensioned to fit around said end of said support. Said first terminal may comprise a conductive member located in said casing and extending between said first electrical contact and an exposed first terminal connector, said support being mechanically connected to or integrally formed with said conductive member such that the support and conductive member are electrically connected to each other. Said support may extend from the first terminal conductive member in a direction towards the second terminal, and said first capacitor is provided on said support, preferably on an end of said support, at a location between said first and second terminals. The support may comprise a base portion that extends laterally from the first terminal conductive member, and an end portion that extends perpendicularly or obliquely from the base portion in a direction towards the second terminal.

Said first capacitor typically comprises first and second electrical conductors, preferably in form of a respective conductive plate, separated by a dielectric medium, wherein said first conductor is electrically, and optionally mechanically, connected to the support, preferably to an end of the support. The first conductor and the support may have at least one respective complementary surface, preferably at least one respective cylindrical surface, to facilitate their inter-engagement.

In preferred embodiments, the first capacitor is dome shaped. Preferably said first capacitor comprises first and second electrical conductors, preferably in form of a respective conductive plate, separated by a dielectric medium, and wherein the first and second conductors and the intermediate dielectric medium are dome shaped. The preferred first capacitor comprises an annular wall portion, the annular wall portion preferably being cylindrical. Preferably said first capacitor is symmetrical about its central axis. Preferably, said first capacitor is U-shaped in cross-section taken parallel with its central axis. Preferably, said first capacitor is circular in cross-section taken perpendicular with its central axis. Said annular wall portion, preferably an inner surface of said annular wall portion, may be mechanically and electrically connected to the support, preferably to a free end of the support. Said first conductor may be electrical and mechanically connected to the support, preferably to a free end of the support.

In preferred embodiments, said voltage divider is a capacitive voltage divider, preferably comprising a second capacitor, said second capacitor being connected between said voltage output and said voltage reference.

Preferred embodiments of the switch device include a casing, preferably an electrically insulating casing, and wherein at least said first and second electrical contacts and said first capacitor are provided in said casing.

In preferred embodiments, the switch device includes a structure having a low, preferably zero or substantially zero, electrical potential during use, and wherein said first capacitor is located adjacent said structure. The low potential structure is advantageously provided in said casing. The low potential structure is conveniently carried by said second terminal.

In preferred embodiments, said second terminal comprises a conductive member located in said casing and extending between said second contact and an exposed second terminal connector, and wherein the low potential structure is carried by said conductive member.

Optionally, the low potential structure comprises an electrically insulated sleeve or coil located around said second terminal.

In preferred embodiments, the low potential structure comprises a coil of a current sensor.

In preferred embodiments, at least said first capacitor is embedded in or enclosed within said electrically insulating material, said material preferably being part of a casing of the switch device.

In typical embodiments, said first and second electrical contacts are part of a vacuum interrupter.

In some embodiments, said switch device is a circuit breaker.

A second aspect of the invention provides an electrical switch device comprising:
 a first electrical terminal connected to a first electrical contact;
 a second electrical terminal connected to a second electrical contact;
 means for actuating said second electrical contact between an open state and a closed state; and
 a voltage sensor for sensing a voltage at the first electrical terminal,
wherein said voltage sensor comprises a voltage divider having a voltage input connected to said first electrical terminal, a voltage output between said voltage input and a voltage reference, and a first capacitor connected between said voltage input and said voltage output, and wherein said first capacitor is dome shaped.

A third aspect of the invention provides a voltage sensor comprising a voltage divider having a voltage input, a voltage output between said voltage input and a voltage reference, and a first capacitor connected between said voltage input and said voltage output, and wherein said first capacitor is dome shaped. Said first capacitor preferably comprises first and second electrical conductors, preferably in form of a respective conductive plate, separated by a dielectric medium, and wherein the first and second conductors and the intermediate dielectric medium are dome shaped.

The invention may be embodied as a circuit breaker that includes a capacitive voltage sensor located within its insulating casing, the voltage sensor including a capacitor located between the terminals of the circuit breaker adjacent a low potential surface provided by a coil of a current sensor. The capacitor is preferably dome shaped.

Preferred embodiments of the invention are advantageous in that the voltages of the circuit breaker or recloser can be monitored without increasing the overall dimensions of the pole of the circuit breaker/recloser, and with only a small increase in mass. Moreover, reliability is improved in comparison with conventional solutions due to the integration of the voltage sensor and its associated circuitry into the main body circuit breaker/recloser pole.

Further advantageous aspects of the invention will be apparent to those ordinarily skilled in the art upon review of the following description of a specific embodiment and with reference to the accompanying drawings.

BRIEF DESCRIPTION OF THE DRAWINGS

An embodiment of the invention is now described by way of example and with reference to the accompanying drawings in which.

DETAILED DESCRIPTION OF THE DRAWINGS

Figure 1:
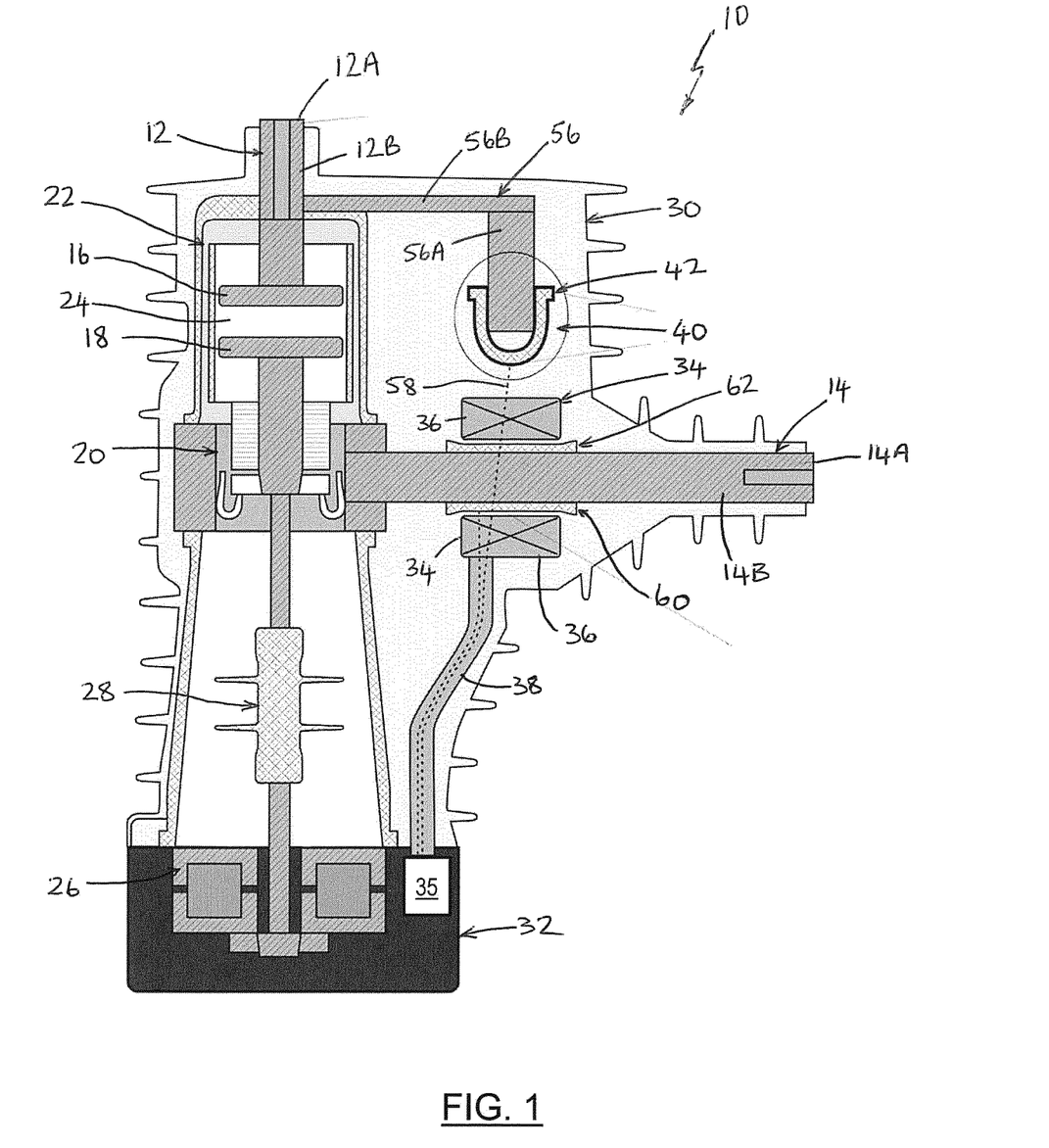
FIG. 1 is a sectioned side view of a vacuum circuit breaker embodying one aspect of the invention.

Referring now in particular to FIG. 1 of the drawings, there is shown, generally indicated as 10 an automatically operating electrical switch device. The illustrated switch device 10 is of a type commonly referred to as a circuit breaker. The switch device 10 is configured to operate automatically in a fault condition, e.g. a current overload or short circuit, to protect the circuit (not shown) into which it is incorporated during use. It achieves this by breaking the electrical circuit in response to detecting a fault, thereby interrupting current flow. As is described in more detail hereinafter, the switch device 10 includes at least one voltage sensor for monitoring the voltage at a respective one, or both, of its terminals. The, or each, voltage sensor may be used to control operation of the switch device 10. In some embodiments, the switch device 10 can be reset manually (e.g. mechanically or electro-mechanically by manual activation of a user control (not shown)) or automatically (typically electro-mechanically in response to the switch device 10 detecting that the fault has gone, and/or after a threshold period of time has expired since activation). Switch devices that reset automatically are commonly known as reclosers. In the embodiment of FIG. 1 the switch device 10 is a vacuum circuit breaker. It will be understood however that the invention is not limited to vacuum circuit breakers and may alternatively be used with other types of circuit breakers, reclosers or other electrical switch devices, and the same or similar description applies as would be apparent to a skilled person. The switch device 10 is particularly intended for use with AC electrical systems, especially AC electrical power systems. The switch device 10 may be configured for use with low voltage (LV), medium voltage (MV), or high voltage (HV) depending on the application. Typically, a respective instance of the switch device 10 is provided for each phase, or each pole, of the AC electrical power provided by the AC electrical power system.

The circuit breaker 10 comprises first and second electrical terminals 12, 14 by which the circuit breaker 10 may be connected to an external circuit (not shown). In use, either one of the terminals 12, 14 is connected to a supply, or line, voltage, and the other terminal 14, 12 is connected to an electrical load. The terminal connected in use to the supply, or line, voltage may be referred to as being, or being part of, the supply, or line, side of the circuit breaker 10, whereas the terminal connected in use to the load may be referred to as being, or being part of, the load side of the circuit breaker 10.

The first terminal 12 is electrically connected to, and may be integrally formed with, a first electrical contact 16. The first contact 16 is typically fixed and may be referred to as the fixed contact 16. The second terminal 14 is electrically connected to a second electrical contact 18. In this example, the second terminal is electrically connected to the contact 18 by means of an electrical pick up assembly 20. The second contact 18 is movable between an open state (as shown in FIG. 1) and a closed state (not illustrated) in which it makes electrical contact with the first contact 16. The open state of the contact 18 corresponds to the open, or breaking, state of the circuit breaker 10 in which it interrupts current flow between the terminals 12, 14. The closed state of the contact 18 corresponds to the closed, or making, state of the circuit breaker 10 in which current is able to flow between the terminals 12, 14 via the contacts 16, 18. In the illustrated embodiment, the contacts 16, 18 are part of a vacuum interrupter 22 and, as such, are located in a vacuum chamber 24.

Movement of the contact 18 between its open and closed states is effected by actuation means comprising an actuator 26 coupled to the contact 18. In the illustrated embodiment, the actuator 26 is an electromagnetic actuator, by may alternatively take other conventional forms, e.g. an electromechanical or piezoelectric actuator. In the illustrated embodiment, a mechanical coupling device 28 couples the actuator 26 and the contact 18 and is configured to translate movement of the actuator 26 into a corresponding movement of the contact 18. In this case, the coupling device 28 translates linear movement of the actuator 26 into linear movement of the contact 18. In some embodiments the actuator 26 may be operable to move the contact 18 from the closed state to the open state and from the open state to the closed state. Alternatively, movement of the contact 18 from the open state to the closed state by be performed manually, in which case the actuation means may include a lever or other manual operating device for this purpose. Movement of the contact 18 from the closed state to the open state is usually performed automatically in response to detection of a fault condition. Movement of the contact from the open state to the closed state may be performed automatically or manually as suits the application.

At least part of the circuit breaker 10 is provided in casing 30. At least part of, and preferably all of, the casing 30 is formed from an electrically insulating material, for example ceramic, rubber, plastics or resins (e.g. epoxide resin or polyester resin). The casing 30 may comprise a moulding or other solid structure in which some or all of the components of the circuit breaker 10 are embedded, i.e. such that some or all of the components of the circuit breaker are moulded into or embedded within the insulating material. For example, the vacuum interrupter 22, voltage sensor 40 (or at least part of it), support 56, and stems 12B, 14B may be embedded in the casing. In the embodiment of FIG. 1, coupling mechanism 28 and current sensor 34 are also embedded in the casing. Alternatively or in addition, all or part of the casing 30 may be hollow, defining one or more cavity for receiving at least some of the components of the circuit breaker 10. In cases where the casing 30 is hollow, it may be coated with a dielectric or electrically insulating material. Typically, at least the contacts 16, 18 are provided in the casing 30, and in the case of a vacuum circuit breaker (as illustrated), the vacuum interrupter 22 is included in the casing 30. The terminals 12, 14 are also provided in the casing 30, a respective connector part 12A, 14A of each terminal 12, 14 being exposed by the casing 30 to allow connection of the circuit breaker 10 to external circuitry and devices as applicable. Typically, each terminal 12, 14 comprises a conductive stem 12B, 14B, or other conductive member, extending between the respective contact 16, 18 and the respective connector part 12A, 12B. The stem 12B, 14B and contact part 12A, 14B of the terminal 12, 14 may be integrally formed or formed separately and be electrically connected, as is convenient. In a typical arrangement, the stems 12B, 14B extend non-parallelly with each other, typically perpendicular or substantially perpendicular, to each other. The stem 12A of the first terminal 12 typically extends along, or parallel with, the axis of movement of the movable contact 18.

In preferred embodiments, the pick up assembly 20 is provided in the casing 30. The coupling device 28 may also be provided in the casing 30. The actuator 26 may be provided in the casing 30 or, as illustrated, may be mechanically fixed or otherwise coupled to the casing 30. For example, the actuator 26 may be provided in a base unit 32 that is connected to the casing 30.

The circuit breaker 10 may include a current sensor 34 for sensing current in the second terminal 14. The current sensor 34 may comprise one or more electric coil 36 provided around a conductive part of the terminal 14, conveniently the stem 14B. The coil 36 typically comprises an electrically insulated conductor. The current sensor 34 may be of any conventional type, for example comprising a Rogowski coil or a current transformer. In preferred embodiments, the current sensor 34 is included in the casing 30. The current sensor 34 is connected to a controller 35 in order to send a signal to the controller that is indicative of the level of current flowing in the terminal 14. The controller 35 is responsive to the signal from the sensor 34 to control the operation of the circuit breaker 10. The controller 35 may include or be connected to circuitry (not shown) for operating the actuator 26 (which in the illustrated embodiment may comprise circuitry for controlling the energisation of the electromagnetic coils of the actuator 26). In particular, the controller 35 may include means for determining if the electrical current or voltage level, as applicable, exceeds a threshold value and, if so, to operate the actuator 26 to cause the contacts 16, 18 to open. In some embodiments, the controller 35 may be configured to cause the actuator 26 to close the contacts 16, 18 depending on one or more other criterion, e.g. determining that an electrical fault has cleared, or after a period of time has expired (e.g. in embodiments where the device 10 is a recloser). The controller 35 may take any convenient form, for example comprising one or more suitably configured electric circuit and/or a suitably programmed microprocessor, microcontroller or other processor. At least part, and optionally all, of the controller 35 may be included in the circuit breaker 10, for example in the casing 30 or, preferably, in the base unit 32. Alternatively, the controller 35 may be provided separately from the circuit breaker 10 and may communicate with the circuit breaker 10 by any conventional optical, wired or wireless means in order to perform any or all of the operations described herein. More generally, the current sensor 34 may be connected to the controller 35 by any conventional means, typically a wired connection. To this end the circuit breaker 10 may include a conduit 38, preferably within the casing 30, for carrying electrical wires or other connectors from the sensor 34 to the controller. In the illustrated example, the conduit 38 carries wires from the coil 36 to the controller which is assumed to be located in the base unit 32. The conduit 38 may also carry wires from the voltage sensors 40, 60 to the controller 35.

Figure 3:
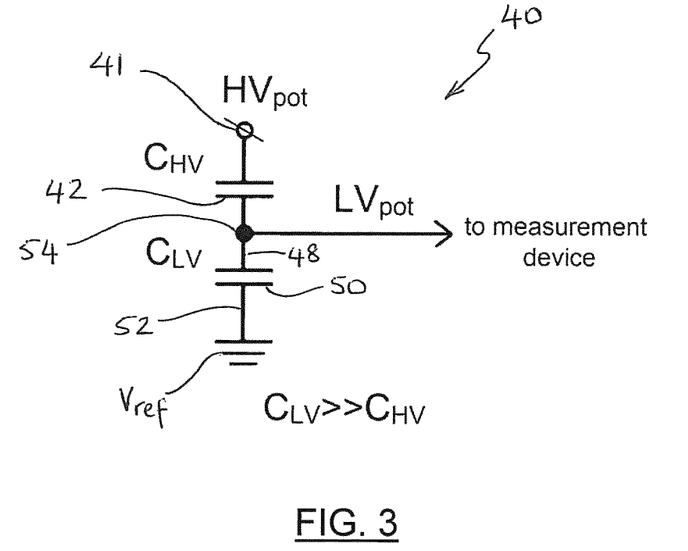
FIG. 3 is a schematic circuit diagram of the voltage sensor of which the capacitor of FIG. 2 is part.

The circuit breaker 10 includes a voltage sensor 40 for sensing the voltage at the first terminal 12. The voltage sensor 40 comprises a voltage divider, preferably a capacitive voltage divider. FIG. 3 illustrates a capacitive voltage divider circuit suitable for use as the voltage sensor 40. The voltage sensor 40 has a first circuit portion between a voltage input 41 and a voltage output 54, and a second circuit portion between the voltage output 54 and a reference voltage Vref, which is conveniently electrical ground or other reference voltage point. The voltage input 41 is connected to the first terminal 12. The first and second circuit portions comprise a respective impedance such that the voltage at output 54 depends on the voltage at the terminal 12 and the relative impedances of the first and second circuit portions. In preferred embodiments, the impedance of the first circuit portion is a capacitance $C_{HV}$, preferably being provided by a first capacitor 42. The impedance of the second circuit portion is a capacitance $C_{LV}$, which is preferably provided by a second capacitor 50. The first capacitor 42 is connected between the voltage input 41 and voltage output 54. The second capacitor 50 is connected between the voltage output 54 and ground. The capacitor 42 therefore has its first terminal 44 electrically connected to the first terminal 12 of the circuit breaker 10 and its second terminal 46 electrically connected to a first terminal 48 of the second capacitor 50, the second terminal 52 of the second capacitor 50 being electrically connected to electrical ground. The output 54 provides an output voltage that depends on the voltage at the terminal 12 and the relative capacitances $C_{HV}$, $C_{LV}$ of the capacitors 42, 50.

The output voltage at the output 54 is lower than the input voltage at terminal 12. The output 54 is provided to the controller 35 which is configured to measure or otherwise detect or evaluate the voltage that the output 54. To this end, the output 54 is connected to the controller 35. The controller 35 may include means for determining if the voltage level at the output 54 exceeds a threshold value, and/or if one or more other characteristic of the voltage signal meets one or more other criteria, which may vary depending on the embodiment. Optionally, based on measured current and/or voltage (as applicable), other electrical parameters of the network are calculated, such as: power, energy, impedance, phase shifts, and so on. Such parameters may be used for operation of relay protection and substation automation. Power and energy measurements may be used for commercial and technical accounting of electricity. The controller 35 is responsive to the signal from the sensor 40, i.e. from the output 54, to control the operation of the circuit breaker 10. The controller 35 may be configured to operate the actuator 26 to cause the contacts 16, 18 to open, typically upon determining that the voltage level at output 54 exceeds a threshold value. In some embodiments, the controller 35 may be configured to cause the actuator 26 to close the contacts 16, 18 depending on one or more other criterion, e.g. determining that the voltage level at the output 54 is at or below a threshold, or after a period of time has expired (e.g. in embodiments where the device 10 is a recloser).

In preferred embodiments, the capacitance $C_{LV}$ of the second capacitor 50 is higher than the capacitance $C_{HV}$ of the first capacitor 42. In typical embodiments in which the terminal 12 is connected to an HV line, the values of the capacitances $C_{LV}$, $C_{HV}$ are selected to cause the voltage at the output 54 to be at a level that is compatible with being received by the controller 35. By way of example, depending on the embodiment typical voltage levels at terminal 12 may be 10 kV, 24 kV or 36 kV, while at output 54 the typical voltage level may be in the order of millivolts or hundreds of volts.

In alternative embodiments (not illustrated) the voltage sensor 40 may comprise alternative forms of voltage divider, in particular with alternative circuit topologies to that illustrated in FIG. 3. For example, either one or both of the capacitances $C_{HV}$, $C_{LV}$ may be implemented as one or more capacitor, e.g. as a single capacitor or a network of more than one capacitor. For example, either one or both of capacitors 42, 50 may be implemented as two or more capacitors in series, or as two or more capacitors in parallel, or other arrangement of capacitors. Optionally, the second circuit portion my comprise one or more capacitors in parallel and/or in series for thermal compensation of the voltage divider. Optionally, one or more resistor may be included in the voltage divider. For example, one or more resistor may be provided in the second circuit portion to compensate for phase shifts.

In preferred embodiments, the first capacitor 42 is located within the casing 30. Advantageously, the first capacitor 42 is located between the first and second terminals 12, 14. In preferred embodiments, the first capacitor 42 is provided on and electrically connected to a conductive support 56. The conductive support 56 is electrically connected to the first terminal 12. Conveniently, the support 56 is mechanically connected to or integrally formed with the stem 12B such that the support 56 and stem 12B are electrically connected to each other. In preferred embodiments, the support 56 extends laterally from the stem 12B, i.e. in a direction that is perpendicular or oblique to the stem 12B. Preferably, the support 56 extends from the stem 12B in a direction towards the second terminal 14. The support 56 may extend from the stem 12B in a direction that is parallel with the stem 14B of the second terminal 14. The support 56 includes an end portion 56A that preferably extends towards the stem 14B of the second terminal 14. In preferred embodiments, the support 56 comprises a base portion 56B that extends laterally from the stem 12B and the end portion 56A extending perpendicularly or obliquely from the base portion 56B in a direction towards the stem 14B. The support 56 may for example be L-shaped. The support 56 may comprise any electrically conductive structure(s), e.g. one or more bar and/or plate, that is capable of supporting the capacitor 42, and is typically metallic but may be formed from any convenient other conductive material(s). In alternative embodiments, alternative support means (not illustrated) may be provided to support the capacitor 42 within the casing 30, for example supporting the capacitor 42 from the stem 14B. In such cases, the capacitor 42 may be electrically connected to the terminal 12 by one or more wire The support 56, or other support means, is advantageously also provided within the casing 30. In preferred embodiments, the assembly of the support 56, or other support means, and the first capacitor 42 is located within the casing 30 in a region between the first and second terminals 12, 14. Locating the capacitor 42 between the first and second terminals 12, 14 is preferred because it makes efficient use of the space between the terminals 12, 14 and so improves the compactness of the circuit breaker 10.

Advantageously, the capacitor 42 is located close to a surface within the casing 30 that has a relatively low electric potential in comparison with the operational voltage of the device 10 (i.e. the normal operational voltage at the terminals 12, 14), preferably at least an order of magnitude (i.e. a power of 10) lower than the operational voltage. The capacitor 42 is preferably located close to a surface within the casing 30 that has an electric potential of zero (or close to zero—preferably 10 volts or less, more preferably 1 volt or less) during use. This may be achieved by locating the capacitor 42 adjacent any structure having a surface that has an electric potential of zero, or close to zero e.g. 10 volts or less, preferably 1 volt or less, during use. The zero, or low, potential surface or structure is typically formed from an electrically conductive material and may be electrically insulated. The preferred arrangement is such that there is no large potential difference (e.g. a potential difference of zero, or up to 1 volt, or up to 10 volts), between the zero, or low, potential structure/surface and the capacitor 42, in particular the terminal (42B) of the capacitor 42 that is connected to the sensor output 54. This arrangement ensures a high degree of accuracy of the sensor 40 and provides the sensor 40 with good dielectric strength. If the capacitor 42 is not located adjacent a surface of zero or low potential, then the relatively high electric potential at terminals 12, 14 can affect the accuracy of the measurement of the sensor 40. The capacitor 42 may be located adjacent any convenient zero, or low, potential structure within the casing 30, or adjacent a zero, or low, potential surface of any structure. In typical embodiments, the capacitor 42, in particular the terminal (42B) of the capacitor 42, is located up to 100 mm, preferably up to 50 mm, and more preferably up to 25 mm from the relevant zero, or low, potential surface.

During use of preferred embodiments, the coil 36 of the current sensor 34 has zero, or low, electric potential in use (the actual value may depend on the operation mode of the current sensor 34 and on the current flowing through the terminal 14). In preferred embodiments, therefore the capacitor 42, and in particular the conductor 42B, is located adjacent the coil 36 of current sensor 34. Advantageously, the capacitor 42 is sufficiently close to the coil 36 that there is a low (e.g. 10 volts or less), zero or substantially zero (e.g. less than 1 volt), potential difference between the capacitor 42 (or at least the conductor 42B) and the surface of the coil 36. In use, the coil 36 typically has zero potential, and conductor 42B of capacitor 42 has near-zero potential on output 54. This improves the dielectric strength and accuracy of the capacitor 42. In typical embodiments, the capacitor 42, in particular the terminal (42B) of the capacitor 42, is located up to 100 mm, preferably up to 50 mm, and more preferably up to 25 mm from the coil 36. In alternative embodiments (not illustrated), for example in which the coil 36 is absent, any other zero, or low, potential surface may be provided in the casing 30, preferably between terminals 12, 14, for locating the capacitor 42 next to. For example, an electrically insulated sleeve (not shown) of conductive material may be provided around the stem 14B and connected to electrical ground (or other voltage reference), and the capacitor 42 may be located adjacent the sleeve.

Figure 2:
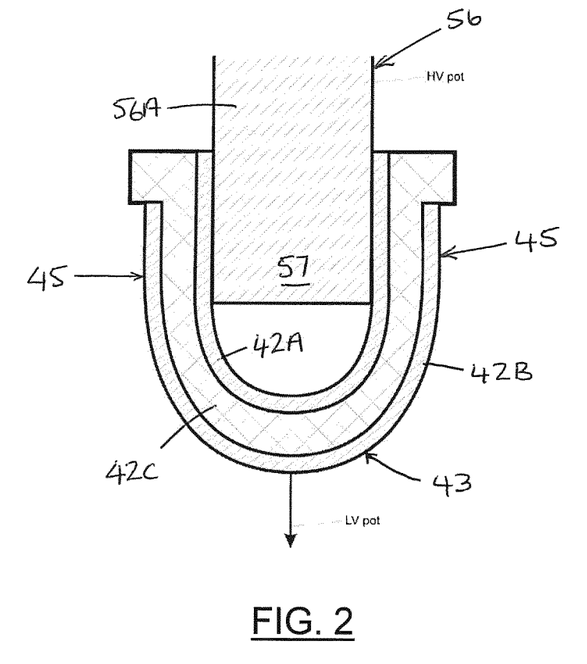
FIG. 2 is a sectioned side view of a capacitor installed on part of the circuit breaker of FIG. 1 and being part of a voltage sensor embodying another aspect of the invention.

In preferred embodiments, the first capacitor 42 is shaped as an annular cap for fitting around an end 57 of the support 56. The preferred first capacitor 42 is dome-shaped, and may also be described as bowl-shaped or bell shaped. Preferably, the first capacitor 42 is symmetrical or substantially symmetrical about a central axis. In preferred embodiments, the first capacitor 42 is U-shaped in cross-section taken in any plane parallel with its central axis.

The first capacitor 42 comprises first and second electrical conductors 42A, 42B separated by a dielectric medium 42C. Each conductor 42A, 42B preferably comprises a conductive plate that is preferably domed or otherwise rounded. The conductors 42A, 42B are dimensioned so that conductor 42A fits within conductor 42B. The conductor 42B provides the outer surface of the domed capacitor 42 while the conductor 42A provides the inner surface of the domed capacitor. The conductors 42A, 42B are typically metallic but may alternatively be formed from any other suitable electrically conductive material. The dielectric medium 42C may comprise any suitable conventional dielectric material, for example glass, ceramic or plastics.

The first conductor 42A is electrically connected to the support 56. As such, the first conductor 42A provides the first terminal 44 of the capacitor 42. The first conductor 42A is also mechanically connected to the support 56, preferably to the end portion 56A. In preferred embodiments, the end portion 56A has a free end 57, the first conductor 42A being located at, and mechanically and electrically connected to, the free end 57. Any convenient coupling means (not shown) may be used to connect the first conductor 42A to the support, for example a conductive sealing ring, or welding. Optionally, the first conductor 42A and the support 56 have at least one respective complementary surface to facilitate their inter-engagement.

The second conductor 42B is electrically connected to the first terminal 48 of the second capacitor 50. Conveniently, the second conductor 42B serves as the second terminal 46 of the first capacitor 42. The second conductor 42B may electrically connected to the first terminal 48 of the second capacitor 50 by any convenient means, e.g. a wire, cable or other electrical conductor. For example, the second conductor 42B and the first terminal 48 may be electrically connected together at the controller 35. In the illustrated embodiment, a wire 58 connects the second conductor 42B to an electrical point (not illustrated) at the controller 35, the electrical point serving as the output 54 of the voltage divider. The second capacitor 50 is not shown in FIG. 1 but may be provided in any convenient location, for example in the casing 30 or in the base unit 32 or in the controller 35, and may have its first terminal 48 connected to the same electrical point at the controller 35 to which conductor 58 is connected. The second terminal 52 of capacitor 50 may be connected to ground (or other reference potential Vref) using any convenient means, e.g. a wire, cable or other electrical conductor. Any suitable conventional capacitor may be used as the second capacitor 50.

In preferred embodiments, the first capacitor 42 is shaped to define a rounded, closed end portion 43, which may be semi-circular in cross-section, and an annular wall portion 45 providing an open mouth. In particular, the first and second conductors 42A, 42B and the intermediate dielectric layer 42C are shaped to define the portions 43, 45 so that each portion 43, 45 comprises a respective part of the conductors 42A, 42B and dielectric 42C. Preferably, the first capacitor 42 is shaped so that at least part of the wall portion 45 is parallel or substantially parallel with the central axis of the capacitor 42, and is preferably cylindrical, in particular such that the inner surface of the wall portion adjacent the mouth is cylindrical. In preferred embodiments, the first capacitor 42, or at least the wall portion 45, is circular in transverse cross-section. Providing a domed capacitor 42 is advantageous in that eliminates or reduces edge effects to promote uniformity of the capacitor's characteristics. Moreover, the domed design of the preferred capacitor 42 causes the electric field between the plates 42A, 42B to be symmetrical or substantially symmetrical which facilitates accurate measurements. Further, the preferred shape of the capacitor 42 allows the capacitor 42 to have sufficient dielectric strength with a minimum, or relatively low, capacitance.

Advantageously, the wall portion 45, conveniently the inner surface of the wall portion 45, of the first capacitor 42 is mechanically and electrically connected to the support 56, preferably to the free end 57. In preferred embodiments, the first capacitor 42 caps the end 57 with annular wall portion 45 extending around the end 57. Preferably, the respective inner surface of the wall portion 45 and the outer portion of the end 57 are shaped in a complementary manner, each preferably being cylindrical, in order to facilitate engagement.

Optionally, the circuit breaker 10 includes a voltage sensor 60 for sensing the voltage at the second terminal 14. The voltage sensor 60 may comprises a voltage divider, preferably a capacitive voltage divider, having a topology that is the same or similar to that shown in FIG. 3. FIG. 1 shows a first capacitor 62 that is analogous to the first capacitor 42 of the voltage sensor 40. The second capacitor of the voltage sensor is not shown but may be provided in any convenient location. The first capacitor 62 may be sleeve-like and located around the stem 14B, optionally inside coil 36.

It will be apparent from the foregoing that preferred embodiments of the invention provide an in-built voltage sensor 40, comprising a capacitor voltage divider, in the casing 30 of the circuit breaker 10 or other switch device e.g. recloser, between the first and second terminals 12, 14. The preferred voltage sensor 40 includes a U-shaped capacitor 42 as part of the voltage dividing circuit which allows use of a capacitor of sufficient dielectric strength and minimum necessary capacitance. The voltage sensor is relatively inexpensive and reliable when compared to conventional alternatives, and has little or no impact on the size of the circuit breaker/recloser. The inbuilt voltage sensor 40 for terminal 12 facilitates use of the circuit breaker or recloser in ring networks, where sensors are required at both terminals of the circuit breaker/recloser.

The invention is not limited to the embodiment(s) described herein but can be amended or modified without departing from the scope of the present invention.

The invention claimed is:

1. An electrical switch device comprising:
   an electrically insulated casing;
   a first electrical terminal connected to a first electrical contact;
   a second electrical terminal connected to a second electrical contact;
   means for actuating said second electrical contact between an open state and a closed state; and
   a voltage sensor for sensing a voltage at the first electrical terminal, wherein said voltage sensor comprises a voltage divider having a voltage input connected to said first electrical terminal, a voltage output between said voltage input and a voltage reference, and a first capacitor connected between said voltage input and said voltage output,
   and wherein at least said first and second electrical contacts and said first capacitor of the voltage sensor are provided in said electrically insulating casing, and wherein said first capacitor of the voltage sensor is located in said casing between said first and second terminals.

2. The switch device of claim 1, wherein said electrically insulating casing comprises an electrically insulating moulding.

3. The switch device of claim 2, wherein said first terminal comprises a conductive member located in said casing and extending between said first electrical contact and an exposed first terminal connector, and said second terminal comprises a conductive member located in said casing and extending between said second contact and an exposed second terminal connector, and wherein said first capacitor is located between said conductive members, and wherein the conductive member of said first terminal and the conductive member of said second terminal are perpendicular, or substantially perpendicular, with one another.

4. The switch device of claim 3, wherein said first capacitor is located closer to the conductive member of said second terminal than to the conductive member of said first terminal.

5. The switch device of claim 3, further including at least one current sensing coil located around the conductive member of said second terminal, said first capacitor being located adjacent said at least one current sensing coil.

6. The switch device of claim 2, wherein said first capacitor is provided on and electrically connected to a conductive support that is located in said electrically insulated casing and is electrically connected to the first terminal, and wherein said first capacitor is provided on an end of said support.

7. The switch device of claim 6, wherein said first terminal comprises a conductive member located in said casing and extending between said first electrical contact and an exposed first terminal connector, said support being mechanically connected to or integrally formed with said conductive member such that the support and conductive member are electrically connected to each other, and wherein said support extends from the first terminal conductive member in a direction towards the second terminal, and said first capacitor is provided on said support at a location between said first and second terminals.

8. The switch device of claim 6, wherein said first capacitor comprises first and second electrical conductors separated by a dielectric medium, wherein said first conductor is electrically and mechanically connected to the support.

9. The switch device of claim 6, wherein said first capacitor has a central axis and is symmetrical about said central axis, and is circular in cross-section taken perpendicular with said central axis.

10. The switch device of claim 1, wherein the first capacitor is dome shaped, and wherein, said first capacitor comprises first and second electrical conductors separated by a dielectric medium, and wherein the first and second conductors and said dielectric medium are dome shaped, and wherein the first capacitor comprises an annular wall portion.

11. The switch device of claim 10, wherein said first capacitor has a central axis and is U-shaped in cross-section taken parallel with said central axis.

12. The switch device of claim 10, wherein said first capacitor is provided on and electrically connected to a conductive support that is located in said electrically insulated casing and is electrically connected to the first terminal, and wherein said first capacitor is provided on an end of said support, and wherein an inner surface of said annular wall portion is mechanically and electrically connected to the support.

13. The switch device of claim 10, wherein said first capacitor is provided on and electrically connected to a conductive support that is located in said electrically insulated casing and is electrically connected to the first terminal, and wherein said first capacitor is provided on an end of said support and is shaped and dimensioned to fit around said end of said support.

14. The switch device of claim 1, wherein said voltage divider is a capacitive voltage divider comprising a second capacitor, said second capacitor being connected between said voltage output and said voltage reference.

15. The switch device of claim 1, further including a low potential structure having a zero or substantially zero electrical potential during use, and wherein said first capacitor is located adjacent said structure.

16. The switch device of claim 15, wherein the low potential structure is provided in said casing, the low potential structure being carried by said second terminal, the low potential structure comprising an electrically insulated sleeve or coil located around said second terminal.

17. The switch device of claim 15, wherein said second terminal comprises a conductive member located in said electrically insulated casing and extending between said second contact and an exposed second terminal connector, and wherein the low potential structure is carried by said conductive member.

18. The switch device of claim 1, wherein at least said first capacitor is embedded in or enclosed within electrically insulating material, said electrically insulating material being part of said electrically insulating casing.

19. The switch device of claim 1, wherein said first and second electrical contacts are part of a vacuum interrupter and/or wherein said switch device is a circuit breaker.

20. An electrical switch device comprising:
   an electrically insulated casing;
   a first electrical terminal connected to a first electrical contact;
   a second electrical terminal connected to a second electrical contact;
   means for actuating said second electrical contact between an open state and a closed state; and
   a voltage sensor for sensing a voltage at the first electrical terminal,
   wherein said voltage sensor comprises a voltage divider having a voltage input connected to said first electrical terminal, a voltage output between said voltage input and a voltage reference, and a first capacitor connected between said voltage input and said voltage output
   and wherein at least said first and second electrical contacts and said first capacitor of the voltage sensor are provided in said electrically insulating casing, and wherein said first capacitor of the voltage sensor is located in said casing between said first and second terminals,
   and wherein said first capacitor is provided on, and is electrically connected to, a conductive support that is located in said electrically insulated casing and is electrically connected to the first terminal, and wherein said first capacitor is provided on an end of said support.

* * * * *